US012772377B2

(12) United States Patent
Jeong et al.

(10) Patent No.: US 12,772,377 B2
(45) Date of Patent: Oct. 20, 2026

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Sang Ho Jeong, Suwon-si (KR); Jong Eun Park, Suwon-si (KR); Chang Hwa Park, Suwon-si (KR); Hyun Hu Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 222 days.

(21) Appl. No.: 18/629,159

(22) Filed: Apr. 8, 2024

(65) Prior Publication Data

US 2025/0016921 A1 Jan. 9, 2025

(30) Foreign Application Priority Data

Jul. 5, 2023 (KR) ........................ 10-2023-0086886

(51) Int. Cl.

| | |
|---|---|
| ***H05K 3/46*** | (2006.01) |
| ***H05K 1/11*** | (2006.01) |
| ***H10W 70/05*** | (2026.01) |
| ***H10W 70/65*** | (2026.01) |
| ***H10W 70/685*** | (2026.01) |

(Continued)

(52) U.S. Cl.

CPC ........... *H05K 1/113* (2013.01); *H05K 3/4682* (2013.01); *H10W 70/05* (2026.01); *H10W 70/095* (2026.01); *H10W 70/65* (2026.01); *H10W 70/685* (2026.01); *H05K 3/0035* (2013.01); *H05K 3/108* (2013.01); *H05K 2201/09481* (2013.01); *H05K 2201/096* (2013.01); *H05K 2203/072* (2013.01); *H05K 2203/0723* (2013.01); *H05K 2203/107* (2013.01)

(58) Field of Classification Search

CPC ......... H05K 1/113; H05K 2201/09481; H05K 3/4682; H05K 3/108; H05K 3/0035

See application file for complete search history.

(56) References Cited

U.S. PATENT DOCUMENTS 9,324,580 B2 4/2016 Kung et al.
2001/0037896 A1* 11/2001 Asai ........................ H01L 23/50 257/E23.07

(Continued)

FOREIGN PATENT DOCUMENTS

KR 10-2015-0064976 A 6/2015

*Primary Examiner* — Jeremy C Norris
(74) *Attorney, Agent, or Firm* — Morgan, Lewis & Bockius LLP

(57) ABSTRACT

A printed circuit board and a method of manufacturing the same are provided. The printed circuit board includes a first insulating layer, a first metal layer disposed on an upper side of the first insulating layer, a second metal layer disposed on a lower side of the first insulating layer, and a first via layer penetrating through at least a portion of the first insulating layer to connect the first metal layer to the second metal layer. The first via layer has a tapered shape becoming narrower toward a top of the first insulating layer, and an upper surface of the first metal layer is substantially flat, and a side surface of the first metal layer has a curved surface.

20 Claims, 6 Drawing Sheets

(51) Int. Cl.
*H05K 3/00* (2006.01)
*H05K 3/10* (2006.01)

(56) References Cited

U.S. PATENT DOCUMENTS

| | | | | |
|---|---|---|---|---|
| 2013/0314886 | A1* | 11/2013 | Kobayashi ............. | H05K 1/112<br>361/767 |
| 2015/0156883 | A1 | 6/2015 | Bong et al. | |
| 2024/0164019 | A1* | 5/2024 | Yang ...................... | H05K 1/113 |

* cited by examiner

PRINTED CIRCUIT BOARD AND METHOD OF MANUFACTURING THE SAME

CROSS-REFERENCE TO RELATED APPLICATION(S)

This application claims benefit of priority to Korean Patent Application No. 10-2023-0086886 filed on Jul. 5, 2023 in the Korean Intellectual Property Office, the disclosure of which is incorporated herein by reference in its entirety.

TECHNICAL FIELD

The present disclosure relates to a printed circuit board and a method of manufacturing the printed circuit board.

Multichip packages including memory chips such as High Bandwidth Memories (HBMs) or the like and processor chips such as Central Processing Units (CPUs), Graphics Processing Units (GPUs), Application Specific Integrated Circuits (ASICs), and Field Programmable Gate Arrays (FPGAs), for data processing that have increased exponentially due to recent developments in artificial intelligence (AI) technology, are being used. In detail, the number of CPU and GPU cores in server products has increased rapidly, and it is necessary to respond to finer chip bump pitches. Therefore, research is continuing to develop substrate and package structures that may reduce the pitch of bumps in response to the demand for higher density, improve connection reliability, and increase yield.

SUMMARY

An aspect of the present disclosure is to provide a printed circuit board in which bumps with a fine pitch may be implemented, in a printed circuit board for mounting electronic components, semiconductor chips, and the like.

An aspect of the present disclosure is to provide a printed circuit board in which protruding bumps may be implemented without etching an insulating layer.

An aspect of the present disclosure is to provide a printed circuit board having improved reliability.

According to an aspect of the present disclosure, a printed circuit board includes a first insulating layer, a first metal layer disposed on an upper side of the first insulating layer, a second metal layer disposed on a lower side of the first insulating layer, and a first via layer penetrating through at least a portion of the first insulating layer to connect the first metal layer to the second metal layer. The first via layer has a tapered shape with a width becoming narrower toward a top of the first insulating layer, and an upper surface of the first metal layer is substantially flat, and a side surface of the first metal layer has a curved surface.

According to an aspect of the present disclosure, a method of manufacturing a printed circuit board includes forming a first barrier layer on a carrier substrate, forming a second barrier layer on the first barrier layer, forming a first insulating layer on the second barrier layer, forming a first through-hole and a second through-hole respectively penetrating through the first insulating layer and the second barrier layer, forming a first metal layer to fill the second through-hole, forming a first via layer to fill the first through-hole, forming a second metal layer on the first insulating layer, and removing the carrier substrate, the first barrier layer, and the second barrier layer.

According to an aspect of the present disclosure, a printed circuit board includes a first insulating layer, a first metal layer disposed on an upper side of the first insulating layer, a second metal layer disposed on a lower side of the first insulating layer, and a first via layer penetrating through at least a portion of the first insulating layer to connect the first metal layer to the second metal layer. The first via layer has a tapered shape with a width becoming narrower toward the first metal layer. The first metal layer, the first via layer, and the second metal layer respectively include a first metal disposed at respective boundaries with the first insulating layer, and a second metal disposed on the first metal.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
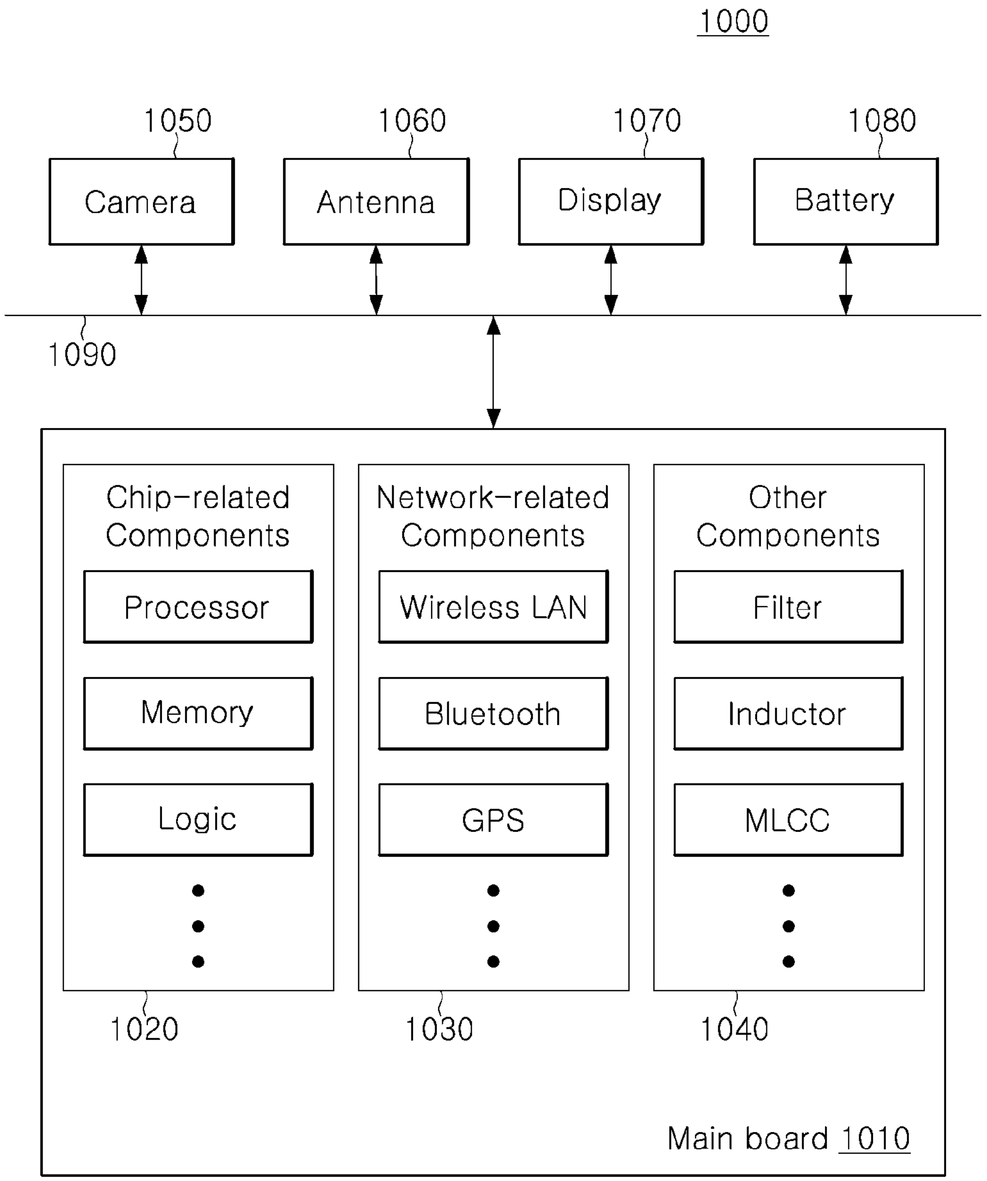
FIG. 1 is a block diagram schematically illustrating an example of an electronic device system.

Hereinafter, the present disclosure will be described with reference to the accompanying drawings. The shapes and sizes of elements in the drawings may be exaggerated or reduced for clearer descriptions.

Electronic Device

FIG. 1 is a block diagram schematically illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related electronic components. In addition, the chip related components 1020 may also be combined with each other. The chip related components 1020 may be in the form of a package including the above-described chips or electronic components.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive elements in the form of chip components used for various other purposes, or the like. In addition, other components 1040 may also be combined with each other, with the chip related components 1020 or the network related components 1030 described above.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, and the like. However, these other electronic components are not limited thereto, and may also be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, other electronic components for various uses may also be included depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
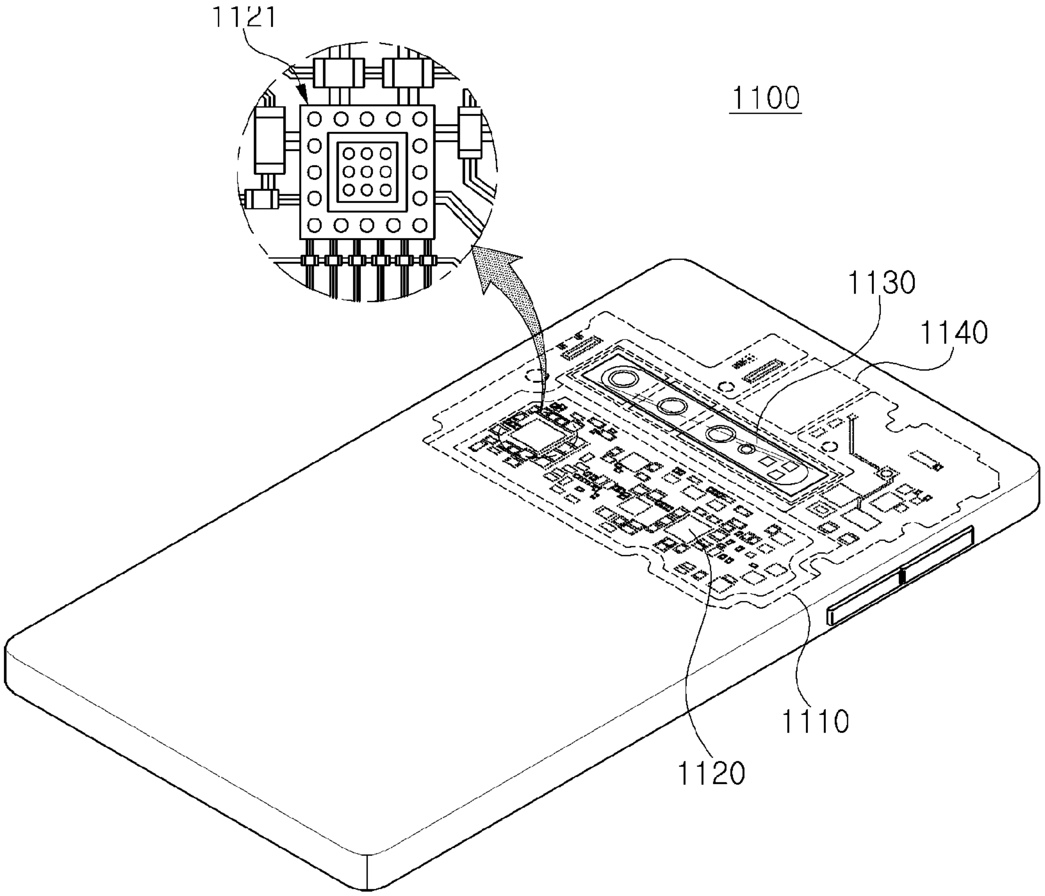
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated inside the smartphone 1100, and various components 1120 are physically or electrically connected to the motherboard 1110. In addition, other components that may or may not be physically or electrically connected to the motherboard 1110, such as a camera module 1130 and/or a speaker 1140, may be accommodated therein. Some of the electronic components 1120 may be the above-described chip related components, for example, a component package 1121, but are not limited thereto. The component package 1121 may be in the form of a printed circuit board on which electronic components including active components and/or passive components are surface mounted. Alternatively, the component package 1121 may be in the form of a printed circuit board in which active components and/or passive components are embedded. On the other hand, the electronic device is not necessarily limited to the smartphone 1100, and may also be other electronic devices as described above.

Printed Circuit Board

Figure 3:
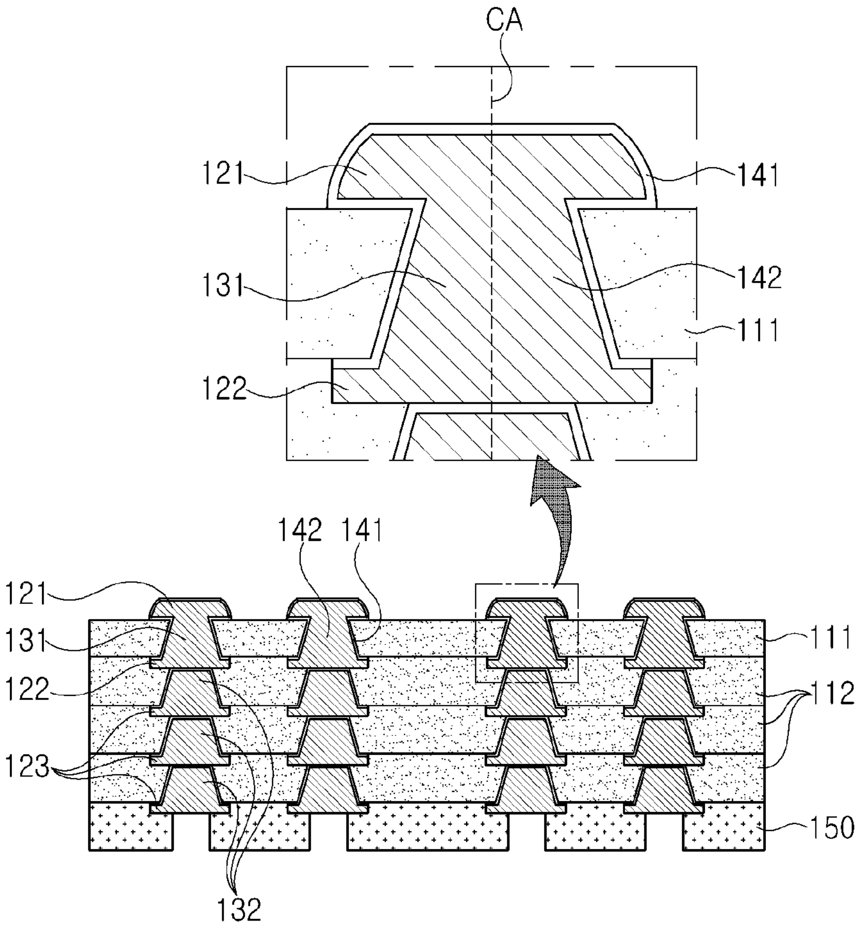
FIG. 3 is a cross-sectional view schematically illustrating a printed circuit board according to an example.

FIG. 3 is a cross-sectional view schematically illustrating a printed circuit board according to an example.

Referring to FIG. 3, a printed circuit board according to an example may include a first insulating layer 111, a first metal layer 121 disposed on an upper side of the first insulating layer 111, a second metal layer 122 disposed on a lower side of the first insulating layer 111, and a first via layer 131 penetrating through at least a portion of the first insulating layer 111 to connect the first metal layer 121 and the second metal layer 122 to each other. The first via layer 131 has a tapered shape that becomes narrower toward the top of the first insulating layer 111, the upper surface of the first metal layer 121 is substantially flat, and the side surface of the first metal layer 121 may have a curved surface.

The first insulating layer 111 may include an insulating material. The insulating material may include thermosetting resins such as epoxy resins, thermoplastic resins such as polyimide, or materials containing these resins along with inorganic fillers, organic fillers, and/or glass fibers (Glass Fiber, Glass Cloth, and/or Glass Fabric). The insulating material may be a photosensitive material and/or a non-photosensitive material. For example, the insulating material of the first insulating layer 111 may be an insulating material of Prepreg (PPG) or Resin Coated Copper (RCC), but is not limited thereto, and may be Ajinomoto Build-up Film (ABF), Photo Imageable Dielectric (PID), FR-4, Bismaleimide Triazine (BT), or the like. However, the present disclosure is not limited thereto, and if necessary, other polymer materials with excellent rigidity may be used.

The first metal layer 121 may include a metal material. The metal material may be copper (Cu), aluminum (Al), silver (Ag), tin (Sn), gold (Au), lead (Pb), titanium (Ti), or alloys thereof. The metal material may include in detail copper (Cu), but is not limited thereto. The first metal layer 121 may perform various functions depending on the design. For example, the first metal layer 121 may be a pad on which electronic components and chips may be mounted, and may perform various functions depending on the design, such as a circuit pattern that performs signal connections with other pads. If the first metal layer 121 requires a high-density fine pitch for mounting semiconductor chips, etc., the gap between the first metal layers 121 may be narrowed, and in the case of mounting electronic components, the gap between the first metal layers 121 may be wider.

The first metal layer 121 may be formed using any one of a semi-additive process (SAP), a modified semi-additive process (MSAP), a tenting (TT) method, or a subtractive method, but is not limited thereto. Since the first metal layer 121 is formed by filling the second through-hole 232 through which the second barrier layer 220 penetrates, as will be described later, and may function as a pad and/or post to reduce the pitch of the bump, to mount a semiconductor chip having a fine pitch. The first metal layer 121 may include an electroless plating layer (or chemical copper) as a seed layer and an electrolytic plating layer (or electrolytic copper) as a plating layer, but is not limited thereto. A sputtering layer may be formed instead of chemical copper as an electroless plating layer. If necessary, copper foil may be further included. The seed layer will be described later. The first metal layer 121 may be disposed on the first insulating layer 111.

The first metal layer 121 may have a structure that protrudes from the upper surface of the first insulating layer 111. The first metal layer 121 may be comprised of a plurality of first metal layers disposed on the same layer. Each of the plurality of first metal layers 121 may have substantially the same height.

At this time, substantially the same is a concept that includes approximate things, and means that it may be judged by including, for example, process errors, position deviations, and measurement errors that occur during the manufacturing process. Since the first metal layer 121 is formed by filling the second through-hole 232 through which the second barrier layer 220 penetrates, as will be described later, a plurality of first metal layers 121 may be formed uniformly. In addition, since the second barrier layer 220 uses a different metal from the first metal layer 121, the first metal layer 121 may be protected during the removal step of the second barrier layer 220, and thus a plurality of first metal layers 121 may be protected. The heights of the metal layers 121 may be substantially the same.

The height of the first metal layer 121 may be measured by photographing a cross section cut in the stacking direction of the printed circuit board using a scanning microscope, etc. The height of the first metal layer 121 may be interpreted in the same manner as the thickness of the first metal layer 121, and the thickness of a configuration may be interpreted as the distance across a configuration vertically, but may include measurement errors or errors in the manufacturing process. For example, the height of the first metal layer 121 may be the average value of the vertical distance between the lower and upper surfaces of the first metal layer 121 measured at five arbitrary points with respect to one first metal layer 121. That the heights of the plurality of first metal layers 121 may be substantially the same as each other means that the measured heights of each first metal layer 121 may be substantially the same as each other.

The upper surface of the first metal layer 121 is substantially flat, and the side surface of the first metal layer 121 may have a curved surface. As will be described later in the manufacturing step of the printed circuit board, the first metal layer 121 may be formed to fill the second through-hole 232 penetrating through the second barrier layer 220. In the operation of forming the second through-hole 232, even if the second barrier layer 220 is completely penetrated so that the upper and lower surfaces of the second barrier layer 220 are connected, the first barrier layer 210 is not removed. The first metal layer 121 may have a substantially flat upper surface. At this time, since the side of the second through-hole 232 penetrating through the second barrier layer 220 may have a curved shape, the side of the first metal layer 121 may have a curved shape. In detail, if the operation of removing the second barrier layer 220 involves chemical etching, the side of the second through-hole 232 penetrating through the second barrier layer 220 may have a curved shape.

The width of the lower surface of the first metal layer 121 may be wider than the width of the upper surface. If the operation of removing the second barrier layer 220 is performed by etching, the second through-hole 232 penetrating through the second barrier layer 220 may have a different width at the upper surface and a lower width, and the second through-hole 232 may be formed to be wider at the lower surface than at the upper surface. Additionally, the side surface of the first metal layer 121 may have a curved surface so that the width at the top is narrowest and the width at the bottom is widest.

The width of the first metal layer 121 may be measured by photographing a cross section cut in the stacking direction of the printed circuit board using a scanning microscope, etc. The width of a configuration may be interpreted as the distance across a configuration horizontally, but may include measurement errors or errors in the manufacturing process. For example, the width at the upper surface of the first metal layer 121 may mean the horizontal distance between both ends of the upper surface with respect to one first metal layer 121. This may be equally applied to measuring the width of the lower surface of the first metal layer 121. At this time, the fact that the width of the lower surface of the first metal layer 121 is wider than the width of the upper surface of the first metal layer 121 may be understood in the same sense that the cross-sectional area of the lower surface of the first metal layer 121 is wider than the cross-sectional area of the upper surface of the first metal layer 121.

The second metal layer 122 may be disposed below the first insulating layer 111. The second metal layer 122 may include a metal material. The metal material may be copper (Cu), aluminum (Al), silver (Ag), tin (Sn), gold (Au), lead (Pb), titanium (Ti), or alloys thereof. The metal material may include in detail copper (Cu), but is not limited thereto. The second metal layer 122 may include the same metal material as the first metal layer 121.

The second metal layer 122 may perform various functions depending on the design of each configuration, such as a circuit pattern that performs a signal connection between the first metal layer 121 and another metal layer, and for example, may include a ground pattern, power pattern, signal pattern, etc. In this case, the signal pattern may include various signals other than ground patterns, power patterns, etc., for example, data signals, etc. These patterns may each include a line pattern, a plane pattern, and/or a pad pattern.

The second metal layer 122 may be formed using any one of a semi-additive process (SAP), a modified semi-additive process (MSAP), a tenting (TT) method, or a subtractive method, but is not limited thereto. The second metal layer 122 may include an electroless plating layer (or chemical copper) as a seed layer and an electrolytic plating layer (or electrolytic copper) as a plating layer, but is not limited thereto. A sputtering layer may be formed instead of chemical copper as an electroless plating layer. If necessary, copper foil may be further included. The seed layer will be described later.

The second metal layer 122 may be comprised of a plurality of second metal layers 122 disposed on the same layer. The second metal layer 122 may be comprised of a plurality of second metal layers 122, and may have the same meaning as saying that the first metal layer 121 may be comprised of a plurality of first metal layers 121. On the other hand, in FIG. 3, to describe the area of one first metal layer 121 and one second metal layer 122 in detail, one first metal layer 121 and one second metal layer 122 are expressed as being comprised of one to one, but the arrangement of the first metal layer 121 and the second metal layer 122 of the printed circuit board according to the example is not limited thereto, and a plurality of first metal layers 121 may be connected by a second metal layer 122, and there may also be parts where the first metal layer 121 and the second metal layer 122 are not connected.

The first via layer 131 may penetrate through at least a portion of the first insulating layer 111 to connect the first metal layer 121 and the second metal layer 122 to each other. The first via layer 131 may have a tapered shape so that the width becomes narrower toward the top of the first insulating layer 111. The fact that the first via layer 131 may be comprised of a plurality of first via layers 131 and the first via layer 131 may be comprised of a plurality of first via layers 131 may have the same meaning as the fact that the first metal layer 121 may be comprised of a plurality of first metal layers 121.

The first via layer 131 may include micro vias. Micro vias may be filled vias that fill a via hole or conformal vias arranged along the wall of the via hole. Micro vias may be arranged in a stacked type and/or staggered type with other via layers.

The first via layer 131 may include a metal material. Metallic materials include copper (Cu), aluminum (Al), silver (Ag), tin (Sn), gold (Au), nickel (Ni), lead (Pb), titanium (Ti), or alloys thereof. The metal material may include in detail copper (Cu), but is not limited thereto. The first via layer 131 may include a metal material such as the first metal layer 121 and the second metal layer 122.

The first via layer 131 may include an electroless plating layer (or chemical copper) as a seed layer and an electrolytic plating layer (or electrolytic copper) as a plating layer, but is not limited thereto. A sputtering layer may be formed instead of chemical copper as an electroless plating layer. The first via layer 113 may perform various functions depending on the design of the corresponding layer, and for example, may include ground vias, power vias, signal vias, and the like. In this case, the signal via may include vias for transmitting various signals, for example, data signals, etc., excluding ground vias, power vias, etc.

The first via layer 131 may be formed by any one of the Semi Additive Process (SAP), Modified Semi Additive Process (MSAP), Tenting (TT), or Subtractive methods, but is not limited thereto. Any method that may construct a circuit on a printed circuit board may be used without restrictions. The first via layer 131 may include an electroless plating layer (or chemical copper) as a seed layer and an electrolytic plating layer (or electrolytic copper) as a plating layer, but is not limited thereto. A sputtering layer may be formed instead of chemical copper as an electroless plating layer. If necessary, copper foil may be further included. The seed layer will be described later.

Each first metal layer 121, each first via layer 131, and each second metal layer 122 may be formed integrally with each other. Being integrally formed may mean that they may be formed simultaneously by one process in one manufacturing step, and may mean that the boundaries between configurations may not be clear. For example, the first metal layer 121, the first via layer 131, and the second metal layer 122 may be formed as one body, so that the boundary between them may not appear. Each of the first metal layer 121, the first via layer 131, and the second metal layer 122 may be comprised of the first metal 141 and the second metal 142, and a boundary may occur between the first metal 141 and the second metal 142, but the present disclosure is not limited thereto, and the boundary may not be clear due to post-processing, etc.

The first metal 141 may be disposed at the boundary between the first metal layer 121 and the first insulating layer 111, may be disposed at the boundary between the first via layer 131 and the first insulating layer 111, and may be disposed at the boundary between the second metal layer 122 and the first insulating layer 111. Each of the first metals 141 may extend along their respective boundaries and be formed as one body. This is because the first metal 141 is formed on the inner walls of the first through-hole 231 and the second through-hole 232 in the manufacturing stage and may be arranged to extend to the lower surface of the first insulating layer 111. The first metal 141 may function as a seed layer for the second metal 142. The first metal 141 may be formed by performing electroless plating (or chemical copper plating), but is not limited thereto. For example, the electroless plating layer may be formed by sputtering instead of chemical copper, and may be used without limitation as long as it is a process of forming a seed for plating.

The second metal 142 may be formed to form the first metal layer 121, the first via layer 131, and the second metal layer 122, and each of the second metals 142 may be formed as one body. This is because the second metal 142 may be formed on the first metal 141 to fill the first through-hole 231 and the second through-hole 232 during the manufacturing step. The second metal 142 may be disposed to contact the first metal 141. The second metal 142 may be formed by performing electrolytic plating (or electroplating), but is not limited thereto, and any process that may form a metal layer may be used without limitation.

As described above, the first metal layer 121, the first via layer 131, and the second metal layer 122 may be formed integrally, and the central axes CA of each of the first metal layer 121, the first via layer 131, and the second metal layer 122 may substantially coincide. The central axis of a certain configuration may refer to the center of a cross-section viewed from the top of a certain configuration and may refer to a virtual line in the stacking direction passing through this center. Alternatively, it may mean a virtual line in the stacking direction that passes through the center of the width of a certain configuration in a cross-sectional view of a printed circuit board cut in the stacking direction. As illustrated in FIG. 3, the central axis of the first metal layer 121, the central axis of the first via layer 131, and the central axis of the second metal layer 122 correspond to virtual lines passing through the center of the width of the configuration in a cross-sectional view of a printed circuit board cut in the stacking direction, and respective Central Axes (CA) may substantially coincide with each other. The fact that the central axes are substantially consistent with each other is a concept that includes approximate things, and means that it may be judged by including, for example, process errors, position deviations, and measurement errors that occur during the manufacturing process. This means that the central axes of the first metal layer 121, the first via layer 131, and the second metal layer 122 are substantially identical. This means that the first metal layer 121, the first via layer 131, and the second metal layer 122 may be formed simultaneously. For example, because the first metal layer 121, the first via layer 131, and the second metal layer 122 may be formed simultaneously, the central axes of each may substantially coincide with each other. In the case of a general printed circuit board, the via and land portion may be formed as one body, but since they are not formed as one body with the pad placed below the via, the so-called eccentricity phenomenon where the central axis of the pad and the central axis of the via are misaligned may occur. The more fine pads and vias are implemented, the greater the effect of eccentricity, and even defects in which the pads and vias are not connected may occur. However, the printed circuit board according to an example fills the first through-hole 231 penetrating through the first insulating layer 111 and the second through-hole 232 penetrating through the second barrier layer 220 at a time. Since the first metal layer 121, the first via layer 131, and the second metal layer 122 are formed, eccentricity may not occur. Therefore, the printed circuit board according to the example may improve reliability while implementing fine patterns.

The upper surface of the first insulating layer 111 of the printed circuit board according to an example may be substantially flat. That the upper surface of the first insulating layer 111 may be substantially flat may mean that the printed circuit board according to an example does not separately process the upper surface of the first insulating layer 111. Unlike the case of using a method of removing part of the top insulating layer to expose the metal post, the printed circuit board according to an example does not process the first insulating layer 111, which means that the first insulating layer 111 has no steps and the upper surface of the first insulating layer 111 may be substantially flat.

Additionally, the surface roughness of the lower surface of the first metal layer 121 may be substantially the same as the surface roughness of the upper surface of the second metal layer 122. When laminating an insulating layer on a circuit pattern, it is common to perform surface treatment on the upper surface of the circuit pattern to ensure adhesion to the insulating layer. In the printed circuit board according to an example, the first metal layer 121 and the second metal layer 122 are formed after stacking the first insulating layer 111 in the manufacturing stage. This is because sufficient adhesion may be secured without performing surface treatment in the area where the first metal layer 121 and the second metal layer 122 are in contact with the first insulating layer 111. For example, since surface treatment of the metal layer is not performed on the area in contact with the first insulating layer 111, the roughness of the lower surface of the first metal layer 121 and the upper surface of the second metal layer 122 may be substantially the same.

The roughness of the lower surface of the first metal layer 121 may be measured by photographing a cross section cut in the stacking direction of the printed circuit board using a scanning microscope, etc. The roughness may be considered as a known roughness measurement method measured by the center line average calculation method (Ra) or a known roughness measurement method measured by the core point average calculation method (Rz) on the cut surface of the first metal layer 121, but is not limited thereto. Any method that may measure illuminance may be used without restrictions. For example, as a non-limiting example, the average position of the lower surface of the first metal layer 121 may be displayed with a virtual line and then measured as the average of the absolute value of the height difference based on the average line, and may also be obtained as the average of the height difference between the five points with the highest height and the five points with the lowest height based on the average line. On the other hand, the illuminance measurement method is not limited thereto, and a more accurate comparison will be possible only when the measurement method used to measure the roughness of the lower surface of the first metal layer 121 and the measuring method used to measure the roughness of the upper surface of the second metal layer 122 are identical.

Since the printed circuit board according to an example forms the first metal layer 121 and the second metal layer 122 after forming the first insulating layer 111, each of the first metal layer 121 and the second metal layer 122 may not be buried in the first insulating layer 111. For example, the first metal layer 121 and the second metal layer 122 may each have a structure protruding from the first insulating layer 111, and the first insulating layer 111 may not cover the side surfaces of the first metal layer 121 and the second metal layer.

A printed circuit board according to an example may further include a second insulating layer 112 disposed below the first insulating layer 111 and burying the second metal layer 122, a third metal layer 123 disposed on or in the second insulating layer 112, and a second via layer 132 penetrating through at least a portion of the second insulating layer 112 to connect the second metal layer 122 to the third metal layer 123 or the third metal layer 123.

The second insulating layer 112, the third metal layer 123, and the second via layer 132 may correspond to the first insulating layer 111, the second metal layer 122, and the first via layer 131, respectively, and may correspond to a configuration that may be included as a general configuration of a printed circuit board. The description related thereto may overlap with the description of the first insulating layer 111, the second metal layer 122, and the first via layer 131, and thus duplicated descriptions are omitted.

The solder resist layer 150 is disposed on the second insulating layer 112 and is disposed on the outermost surface of the printed circuit board to protect the printed circuit board from the outside. The solder resist layer 150 may use a known solder resist, and the solder resist layer 150 may include a thermosetting resin and an inorganic filler dispersed in the thermosetting resin, but may not include glass fiber. The insulating resin may be a photosensitive insulating resin, and the filler may be an inorganic filler and/or an organic filler, but is not limited thereto. If necessary, other polymer materials may be used. The solder resist layer 150 may have an opening, and at least a portion of the third metal layer 123 may be exposed through the opening. The third metal layer 123 exposed through the opening may be connected to a main board or another printed circuit board, and may also be connected to other devices such as a semiconductor chip.

On the other hand, the printed circuit board according to an example is not limited to the configuration illustrated in FIG. 3, and may further include general configurations of printed circuit boards, and in detail, may include additional configurations that may be used by anyone with ordinary knowledge in the relevant technical field.

Method of Manufacturing Printed Circuit Board

Figure 4:
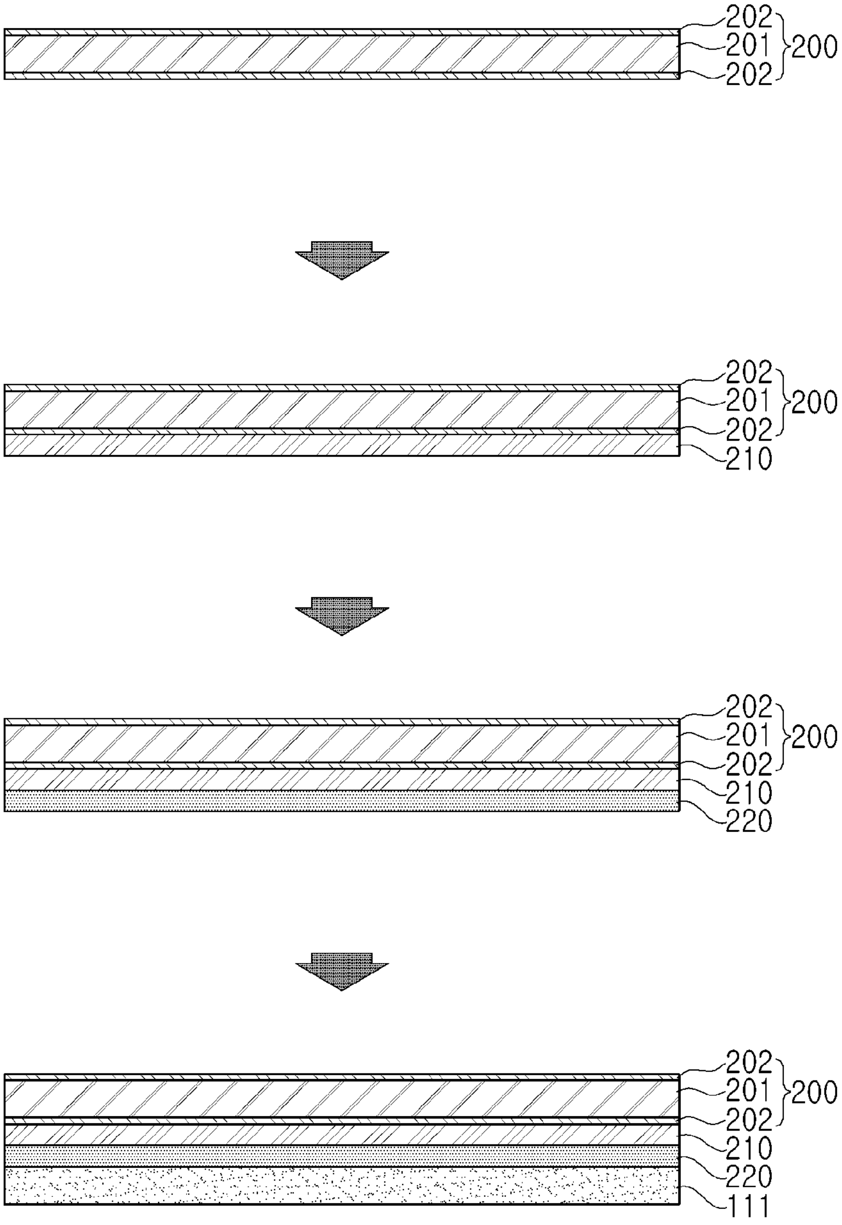
FIGS. 4 to 6 are cross-sectional views schematically illustrating a method of manufacturing a printed circuit board according to an example.
Figure 5:
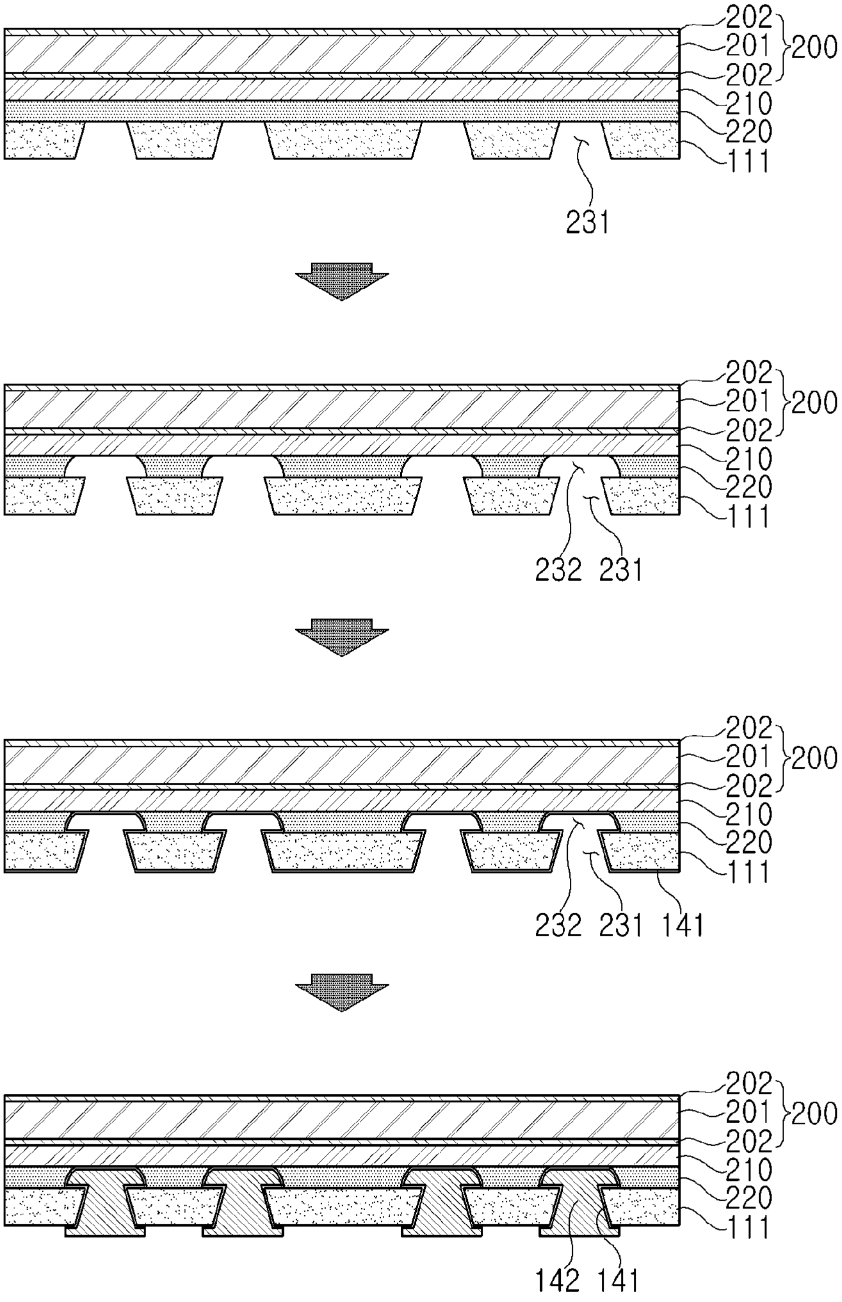
Figure 6:
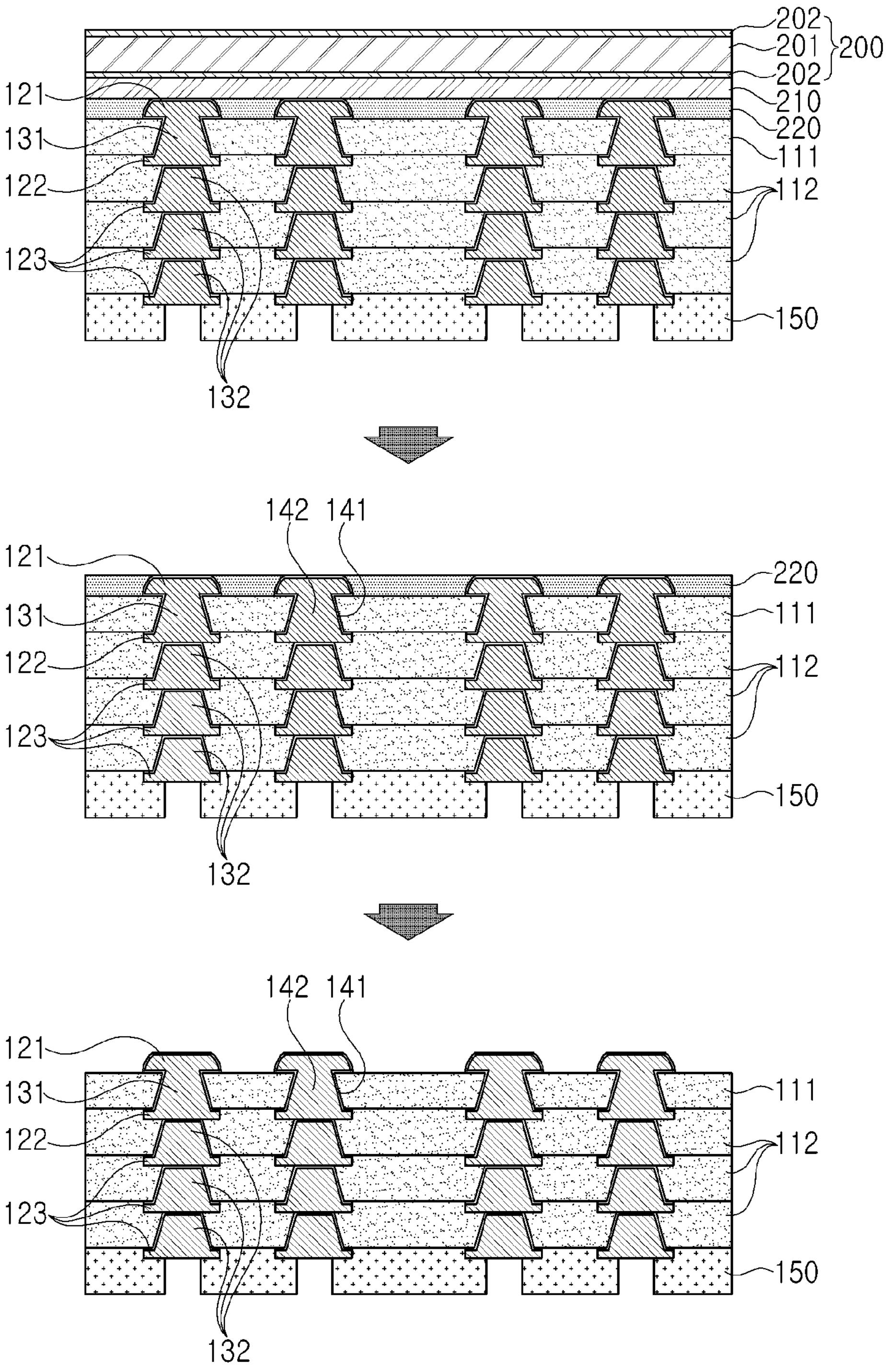

FIGS. 4 to 6 are cross-sectional views schematically illustrating a method of manufacturing a printed circuit board according to an example.

Referring to FIG. 4, a method of manufacturing a printed circuit board according to an example may include forming a first barrier layer 210 on a carrier substrate 200, forming a second barrier layer 220 on the first barrier layer 210, and forming a first insulating layer 111 on the second barrier layer 220.

The carrier substrate 200 may include a core 201 and copper foil 202 formed on one or both sides thereof. The core 201 is used to support an insulating layer and/or a circuit layer when forming it, and may be made of an insulating material or a metal material. The copper foil 202 may be formed of copper, but is not limited thereto. The carrier substrate 200 described above is an example of one case, and the carrier substrate may be used by anyone with ordinary knowledge in the relevant technical field. Anything that is used as a support substrate and may be detached or removed later may be used in the present disclosure without any particular restrictions.

The first barrier layer 210 may function as an etching stopper for the second barrier layer 220 in the process of processing the second barrier layer 220, which will be described later. The first barrier layer 210 may include metal or metal oxide. As a metal material, silver (Ag), aluminum (Al), tin (Sn), gold (Au), lead (Pb), titanium (Ti), or alloys thereof may be used, and stainless steel metal (SUS) may be used. Metal oxides may include alumina (Al2O3), silica (SiO-2), etc. At this time, if the first barrier layer 210 contains a metal oxide, the first barrier layer 210 may be formed in the form of a thin film. The first barrier layer 210 may include in detail silver (Ag) or alumina (Al2O3), but is not limited thereto. Any material that is different from the copper foil 202 of the carrier substrate 200 and/or the second barrier layer 220 formed later is sufficient, and in the operation of processing the second barrier layer 220, the first barrier layer 210 may be used without particular restrictions as long as it may perform a stopper function to prevent it from being processed.

The second barrier layer 220 is an area where the second through-hole 232 will be formed in a step to be described later, and may correspond to a layer where the first metal layer 121 will be formed later. The second barrier layer 220 may include a metal material. The metal material may be nickel (Ni), aluminum (Al), tin (Sn), gold (Au), lead (Pb), titanium (Ti), or alloys thereof. The second barrier layer 220 may include in detail nickel (Ni), but is not limited thereto. Since it should be separated from the first metal layer 121 afterward, a material different from the first metal layer 121 is sufficient. Any material that is easy to separate from the first metal layer 121 may be used without particular restrictions.

Since the description of the first insulating layer 111 overlaps with the content described above in the printed circuit board, description thereof is omitted.

Referring to FIG. 5, a method of manufacturing a printed circuit board according to an example may include forming a first through-hole 231 penetrating through the first insulating layer 111, forming a second through-hole 232 penetrating through the second barrier layer 220, forming a first metal layer 121 to fill the second through-hole 232, forming a first via layer 131 to fill the first through-hole 231, and forming a second metal layer 122 on the first insulating layer 111.

The operation of forming the first through-hole 231 penetrating through the first insulating layer 111 may be performed by laser drilling, mechanical drilling, etc., but is not limited thereto. Any method that may penetrate the insulating layer may be used without restrictions. On the other hand, when performing laser drilling, a $CO_2$ laser or YAG laser may be used, but the present disclosure is not limited thereto. The first through-hole 231 may be formed as thick as the first insulating layer 111 to penetrate the upper and lower surfaces of the first insulating layer 111. When the first through-hole 231 is formed through drilling, the first through-hole 231 may have a tapered shape. In detail, the first through-hole 231 may have a tapered shape so that the width in the direction of the second barrier layer 220 is narrowest. Therefore, in the printed circuit board according to the example, the first via layer 131 has the narrowest width at the top of the first insulating layer 111, and the first insulating layer 111 may have a tapered shape so that the width at the bottom is widest.

The operation of forming the second through-hole 232 penetrating through the second barrier layer 220 may be performed through an etching process, but is not limited thereto. Any method that allows penetration by removing part of the metal material of the second barrier layer 220 may be used without limitation. As an etching process, wet etching or dry etching may be used. The second through-hole 232 may be formed as thick as the second barrier layer 220 so as to penetrate the upper and lower surfaces of the second barrier layer 220. At this time, when the second through-hole 232 is formed by wet etching, the side of the second through-hole 232 may have a curved shape, and the width of the upper surface may be formed to be narrower than the width of the lower surface. This may occur depending on the degree of penetration of the etching solution in the wet etching process. Because the first barrier layer 210 exists even if the second through-hole 232 completely penetrates the second barrier layer 220, the first metal layer 121 formed later may have a substantially flat upper surface. Since the first through-hole 231 is first formed and then the second through-hole 232 is formed and the second through-hole 232 is wet etched to achieve isotropy, the central axes of the first through-hole 231 and the second through-hole 232 may substantially coincide, and the possibility of eccentricity errors occurring in the first metal layer 121, the first via layer, and the second metal layer 122 may be reduced.

The operation of forming the first metal layer 121, the first via layer 131, and the second metal layer 122 may be performed by forming a first metal 141 along the outer surfaces of the first through-hole 231 and the second through-hole 232 and the lower surface of the first insulating layer 111, and forming a second metal 142 on the first metal 141, and then, by removing part of the first metal 141 and the second metal 142. Because the operation of forming the first metal 141 and the operation of forming the second metal 142 may each be performed in one step, the first metal layer 121, the first via layer 131, and the second metal layer 122 may be formed as one body.

The operation of forming the first metal 141 may be performed through electroless plating, and the first metal 141 may function as a seed for forming the second metal 142. The operation of forming the second metal 142 may be performed through electroplating using the first metal 141 as a seed. Thereafter, the operation of forming the first metal 141 and the second metal 142 may be completed by removing the remaining portion of the first metal 141 and the second metal 142 except for the necessary area.

Referring to FIG. 6, a method of manufacturing a printed circuit board according to an example may further include forming a second insulating layer 112 to bury a second metal layer 122 on the first insulating layer 111, forming a second via layer 132 penetrating through at least a portion of the second insulating layer 112, forming a third metal layer 123 on the second insulating layer 112, and forming a solder resist layer 150. After forming the first metal layer 121, the first via layer 131, and the second metal layer 122, the printed circuit board may be configured to further include other components, and the number of layers of the second insulating layer 112, third metal layer 123, and second via layer 132 may be designed without limitation.

A method of manufacturing a printed circuit board according to an example may include removing the carrier substrate 200, the first barrier layer 210, and the second barrier layer 220.

In the operation of removing the carrier substrate 200, the copper foil 202 may be removed after the core 201 is removed, or the core 201 and the copper foil 202 may be removed simultaneously. The operation of removing the carrier substrate 200 may be performed using a known process used for carrier detach without limitation.

The operation of removing the first barrier layer 210 may be performed by etching, but is not limited thereto. The operation of removing the first barrier layer 210 may be performed through different processes depending on the constituent material of the first barrier layer 210, and any process that may remove the constituent materials of the first barrier layer 210 may be used without limitation. Different conditions may be implemented depending on the material of the first barrier layer 210. Because the second through-hole 232 penetrating through the second barrier layer 220 penetrates the upper and lower surfaces of the second barrier layer 220, and the first metal layer 121 is formed to fill the second through-hole 232, and when the operation of removing the first barrier layer 210 is performed, the upper surface of the first metal layer 121 may be exposed to the outside.

The operation of removing the second barrier layer 220 may be performed by etching. Since the constituent materials of the first barrier layer 210 and the second barrier layer 220 are different, the removal of the second barrier layer 220 may be performed under different conditions from the removal step of the first barrier layer 210. At this time, since the second barrier layer 220 includes a different material from the first metal layer 121 and the first metal layer 121 remains even if the operation of removing the second barrier layer 220 is performed, a structure in which the first metal layer 121 protrudes from the first insulating layer 111 may be completed.

FIGS. 4 to 6 are illustrated as being configured only on the lower surface of the carrier substrate 200. The same process may be performed on the upper surface of the carrier substrate 200 to manufacture a printed circuit board with a symmetrical structure. In this case, two printed circuit boards with the same structure may be manufactured through one carrier board 200.

In addition, as described above in the description of the printed circuit board according to an example, the general configuration of the printed circuit board may be further included, and if it does not change the technical meaning of the present disclosure, additions or omissions may be freely made.

As set forth above, according to an embodiment, a printed circuit board in which bumps with a fine pitch may be implemented, in a printed circuit board for mounting electronic components, semiconductor chips, and the like, may be provided.

In addition, a printed circuit board in which protruding bumps may be implemented without etching an insulating layer may be provided.

Further, a printed circuit board having improved reliability may be provided.

In the present disclosure, the meaning of cross-section may mean the cross-sectional shape when the object is cut vertically, or the cross-sectional shape when the object is viewed from a side view. Additionally, the meaning on a plane may be the shape when the object is cut horizontally, or the plane shape when the object is viewed from a top-view or bottom-view.

In the present disclosure, upper surface, upper surface, upper surface, etc. are used for convenience to refer to the direction toward the surface on which electronic components may be mounted based on the cross section of the drawing, and lower side, bottom, lower surface, etc. are used in the opposite direction. However, this direction is defined for convenience of explanation, and of course, the scope of the patent claims is not particularly limited by the description of this direction.

In the present disclosure, the meaning of connected is a concept that includes not only directly connected, but also indirectly connected through an adhesive layer or the like. In addition, the meaning of being electrically connected is a concept that includes both cases where it is physically connected and cases where it is not connected. Additionally, expressions such as first, second, etc. are used to distinguish one component from another component and do not limit the order and/or importance of the components. In some cases, the first component may be named the second component without departing from the scope of rights, and similarly, the second component may be named as the first component.

The expression ‘example’ used in the present disclosure does not mean identical embodiments, but is provided to emphasize and explain different unique features. However, the examples presented above do not exclude being implemented in combination with features of other examples. For example, even if what is described in an example is not described in another example, unless there is a contrary or contradictory explanation in another example, it may be understood as an explanation related to another example.

The terminology used in this disclosure is used to describe examples only and is not intended to limit the disclosure. At this time, singular expressions include plural expressions, unless the context clearly indicates otherwise.

While example embodiments have been illustrated and described above, it will be apparent to those skilled in the art that modifications and variations could be made without departing from the scope of the present disclosure as defined by the appended claims.

What is claimed is:

1. A printed circuit board comprising:
- a first insulating layer;
- a first metal layer disposed on a substantially flat upper surface of the first insulating layer;
- a second metal layer disposed on a lower surface of the first insulating layer; and
- a first via layer penetrating through at least a portion of the first insulating layer to connect the first metal layer to the second metal layer,
- wherein the first via layer has a tapered shape with a width becoming narrower toward a top of the first insulating layer, and
- an upper surface of the first metal layer, spaced apart from the first insulating layer, is substantially flat, and a side surface of the first metal layer has a curved surface.

2. The printed circuit board of claim 1, wherein the side surface of the first metal layer has the curved surface such that an upper width of the first metal layer is narrowest and a lower width of the first metal layer is widest.

3. The printed circuit board of claim 1, wherein the first metal layer, the first via layer, and the second metal layer respectively include a first metal disposed at respective boundaries of the first metal layer, the first via layer and the second metal layer with the first insulating layer.

4. The printed circuit board of claim 3, wherein the first metal extends along the respective boundaries of the first metal layer, the first via layer and the second metal layer with the first insulating layer and is integrally provided.

5. The printed circuit board of claim 4, wherein the first metal layer, the first via layer, and the second metal layer include a second metal disposed on the first metal,
- wherein the second metal extends to and is integrally configured with the first metal layer, the first via layer, and the second metal layer.

6. The printed circuit board of claim 5, wherein respective central axes of the first metal layer, the first via layer, and the second metal layer are substantially identical.

7. The printed circuit board of claim 1, wherein the first metal layer includes a plurality of patterns,
- wherein heights of the plurality of patterns are substantially the same as each other.

8. The printed circuit board of claim 1, wherein a width of a lower surface of the first metal layer is wider than a width of an upper surface of the first via.

9. The printed circuit board of claim 1, wherein roughness of a lower surface of the first metal layer is substantially the same as roughness of an upper surface of the second metal layer.

10. The printed circuit board of claim 1, further comprising:

a second insulating layer disposed on a lower surface of the first insulating layer and burying the second metal layer;

a third metal layer disposed on or within the second insulating layer; and a second via layer penetrating through at least a portion of the second insulating layer.

11. A method of manufacturing a printed circuit board, comprising:

forming a first barrier layer on a carrier substrate;

forming a second barrier layer on the first barrier layer;

forming a first insulating layer on the second barrier layer;

forming a first through-hole penetrating through the first insulating layer;

forming a second through-hole penetrating through the second barrier layer;

after forming the first through-hole and the second through-hole, forming a first metal layer to fill the second through-hole, a first via layer to fill the first through-hole, and a second metal layer on the first insulating layer;

removing the carrier substrate, the first barrier layer, and the second barrier layer.

12. The method of claim 11, wherein the forming the second through-hole penetrating through the second barrier layer is performed by penetrating through the second barrier layer to connect upper and lower surfaces of the second barrier layer to each other.

13. The method of claim 11, wherein the forming the first metal layer, the first via layer, and the second metal layer is performed by forming a first metal along outer surfaces of the first through-hole and the second through-hole and forming a second metal on the first metal.

14. The method of claim 13, wherein the forming the first metal is performed by electroless plating, and the forming the second metal is performed by electrolytic plating.

15. The method of claim 14, wherein the first metal layer, the first via layer, and the second metal layer are integrated.

16. The method of claim 11, wherein the forming the first through-hole is performed by a drilling process, and the forming the second through-hole is performed by an etching process.

17. A printed circuit board comprising:

a first insulating layer;

a first metal layer disposed on a substantially flat upper surface of the first insulating layer;

a second metal layer disposed on a lower surface of the first insulating layer; and a first via layer penetrating through at least a portion of the first insulating layer to connect the first metal layer to the second metal layer, wherein the first via layer has a tapered shape with a width becoming narrower toward the first metal layer, and the first metal layer, the first via layer, and the second metal layer respectively include a first metal disposed at respective boundaries with the first insulating layer, and a second metal disposed on the first metal.

18. The printed circuit board of claim 17, wherein a width of a lower surface of the first metal layer is wider than a width of an upper surface of the first via.

19. The printed circuit board of claim 17, further comprising:

a second insulating layer disposed on a lower surface of the first insulating layer and burying the second metal layer;

a third metal layer disposed on or within the second insulating layer; and a second via layer penetrating through at least a portion of the second insulating layer.

20. The printed circuit board of claim 19, wherein a lower surface of the second metal layer, from which the second via extends, includes a portion spaced apart from the first metal.

* * * * *